United States Patent
Ouyang et al.

(10) Patent No.: US 9,881,697 B2
(45) Date of Patent: Jan. 30, 2018

(54) DYNAMIC-SHIFTING REDUNDANCY MAPPING FOR NON-VOLATILE DATA STORAGE

(71) Applicant: SanDisk Technologies, Inc., Plano, TX (US)

(72) Inventors: Jingwen Ouyang, Milpitas, CA (US); Tz-Yi Liu, Palo Alto, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/061,856

(22) Filed: Mar. 4, 2016

(65) Prior Publication Data

US 2017/0256328 A1    Sep. 7, 2017

(51) Int. Cl.
| | |
|---|---|
| G11C 29/00 | (2006.01) |
| G11C 29/04 | (2006.01) |
| G11C 7/06 | (2006.01) |
| G11C 7/12 | (2006.01) |

(52) U.S. Cl.
CPC ........... *G11C 29/76* (2013.01); *G11C 7/06* (2013.01); *G11C 7/12* (2013.01); *G11C 29/04* (2013.01)

(58) Field of Classification Search
CPC .................................. G11C 29/26; G11C 7/06
USPC ......................................................... 365/200
See application file for complete search history.

(56) References Cited

U.S. PATENT DOCUMENTS

| | | | |
|---|---|---|---|
| 5,386,386 A | 1/1995 | Ogihara | |
| 5,708,612 A * | 1/1998 | Abe | G11C 29/24 365/200 |
| 6,038,179 A | 3/2000 | Eustis et al. | |
| 6,141,268 A | 10/2000 | Chen et al. | |
| 6,144,591 A | 11/2000 | Vlasenko et al. | |
| 7,134,057 B1 * | 11/2006 | Kaushik | G11C 29/808 714/710 |
| 7,142,471 B2 | 11/2006 | Fasoli et al. | |
| 7,515,469 B1 | 4/2009 | Chen et al. | |
| 7,633,800 B2 | 12/2009 | Adusumilli et al. | |
| 7,788,550 B2 | 8/2010 | Merandat et al. | |
| 8,767,488 B1 | 7/2014 | Srinivasan et al. | |
| 2006/0221728 A1 * | 10/2006 | Fasoli | G11C 29/76 365/200 |
| 2012/0155196 A1 * | 6/2012 | Tomita | G11C 29/846 365/189.15 |
| 2013/0117636 A1 * | 5/2013 | Kim | G11C 29/848 714/773 |

* cited by examiner

*Primary Examiner* — Son Mai
*Assistant Examiner* — Muna A Techane
(74) *Attorney, Agent, or Firm* — Kunzler, PC

(57) ABSTRACT

Apparatuses, systems, methods, and computer program products are disclosed for redundancy mapping. A controller is configured to determine that one or more defects affect a subset of a first group of cells and a subset of a second group of cells of a non-volatile memory medium. A non-volatile memory medium may include a plurality of groups of cells, and redundant groups of cells may be available for replacing defective groups of cells. A controller is configured to store a mapping between affected subsets of first and second groups of cells and a redundant group of cells for a non-volatile memory medium. A controller is configured to read data for a first group and/or second group of cells by referencing a mapping and using a redundant group of cells.

18 Claims, 8 Drawing Sheets

US 9,881,697 B2

DYNAMIC-SHIFTING REDUNDANCY MAPPING FOR NON-VOLATILE DATA STORAGE

TECHNICAL FIELD

The present disclosure, in various embodiments, relates to data storage and more particularly relates to using spare groups of storage cells to replace faulty groups of storage cells.

BACKGROUND

Some types of data storage media or data storage devices store data in storage cells. Cells may be grouped together in a variety of ways. For example, a bit line, a word line, a page, an erase block, or the like may correspond to a group of cells. Various types of faults may prevent data from being accurately written to, or read from, a group of storage cells. Accordingly, certain types of data storage media include spare or redundant groups of cells for replacing faulty groups of cells. A mapping between a spare group of cells and a faulty group of cells may allow storage requests for the faulty group of cells to be serviced using the spare group of cells instead of the faulty group. Faults that affect multiple groups of cells may be fixed by replacing the multiple affected groups with multiple corresponding groups of cells from the spare area of the storage medium.

SUMMARY

Methods are presented for redundancy mapping. In one embodiment, a method includes determining that one or more faults affect a portion of a first group of storage cells and a portion of a second group of storage cells of a non-volatile storage medium. In a certain embodiment, a non-volatile storage medium includes a plurality of groups of storage cells. In a further embodiment, spare groups of storage cells are available for replacing faulty groups of storage cells. In one embodiment, a method includes recording a mapping entry that maps affected portions of first and second groups of storage cells to a spare group of storage cells for a non-volatile storage medium. In a further embodiment, a method includes servicing a storage request for a first group and/or a second group of storage cells by referencing a mapping entry and using a spare group of storage cells.

Apparatuses are presented for redundancy mapping. In one embodiment, a controller is configured to determine that one or more defects affect a subset of a first group of cells and a subset of a second group of cells of a non-volatile memory medium. In a certain embodiment, a non-volatile memory medium includes a plurality of groups of cells. In a further embodiment, redundant groups of cells are available for replacing defective groups of cells. In one embodiment, a controller is configured to store a mapping between affected subsets of first and second groups of cells and a redundant group of cells for a non-volatile memory medium. In a further embodiment, a controller is configured to read data for a first group and/or a second group of cells by referencing a mapping and using a redundant group of cells.

Computer program products comprising a computer readable storage medium are presented. In certain embodiments, a computer readable storage medium stores computer usable program code executable to perform operations for redundancy mapping. In one embodiment, an operation includes using a spare group of storage cells in place of both a second half of a first group of storage cells and a first half of a second group of storage cells of a non-volatile storage medium in response to determining that one or more faults affect the second half of the first group of storage cells and the first half of the second group of storage cells. An operation, in a further embodiment, includes using a second spare group of storage cells in place of just a third group of storage cells in response to determining that one or more faults affect a first half of the third group of storage cells.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
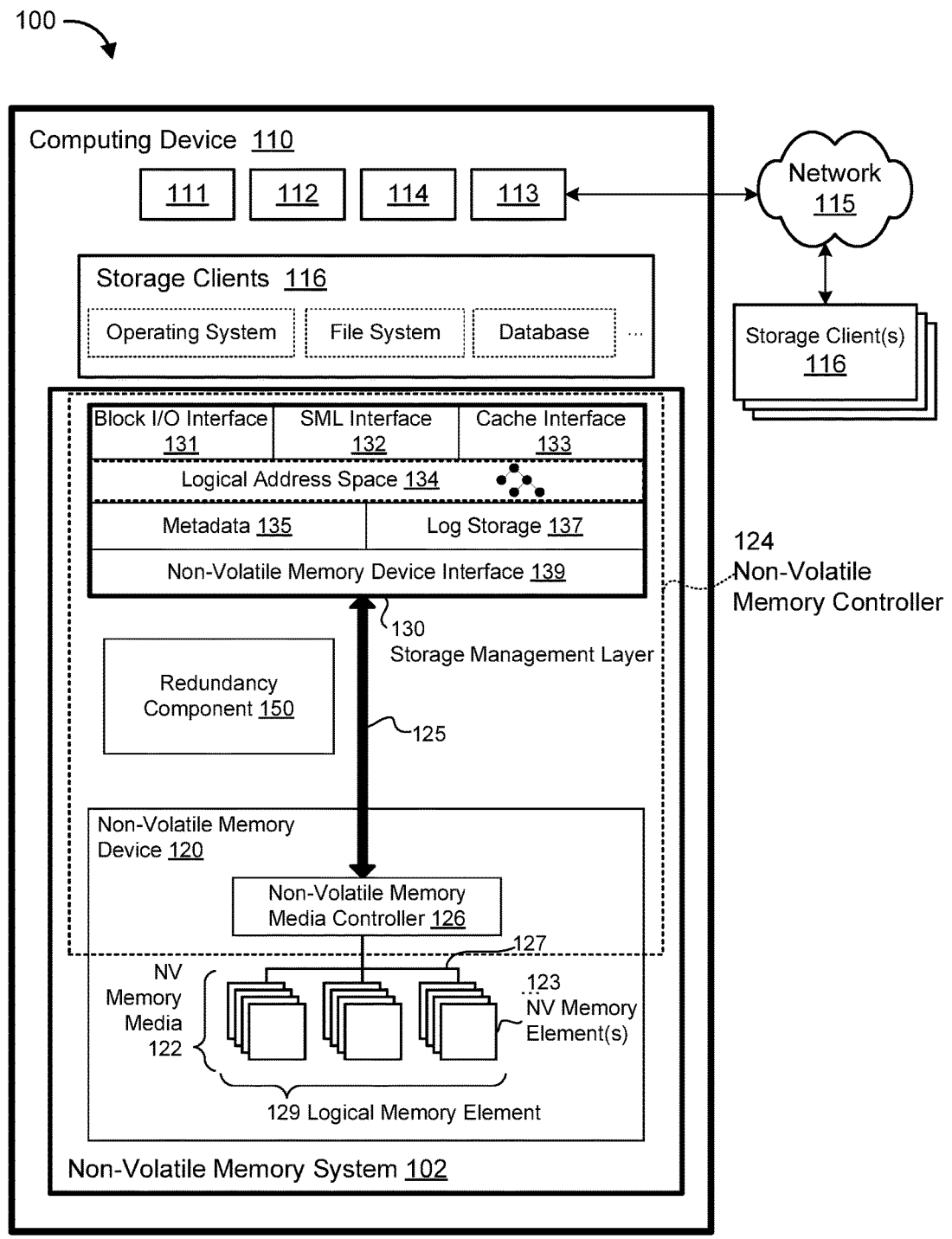
FIG. 1 is a schematic block diagram of one embodiment of a system comprising a redundancy component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, resistive (e.g., resistive random access memory (ReRAM), memory resistor (Memristor) memory, programmable metallization cell memory, phase-change memory (PCM, PCME, PRAM, PCRAM, ovonic unified memory, chalcogenide RAM, or C-RAM), or the like), or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a redundancy component 150. The redundancy component 150 may be part of and/or in communication with one or more of a non-volatile memory element 123, a non-volatile memory controller 124, a non-volatile memory media controller 126, a device driver or storage management layer (SML) 130, or the like. The redundancy component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the redundancy component 150 may be embodied as one or more computer readable instructions stored on the non-transitory storage medium 114.

The non-volatile memory system 102, in the depicted embodiment, includes a redundancy component 150. The redundancy component 150, in one embodiment, is configured to determine that one or more faults affect a portion of a first group of storage cells and a portion of a second group of storage cells for a non-volatile memory medium 122. In a further embodiment, the non-volatile memory medium 122 may include a plurality of groups of storage cells, and spare groups of storage cells may be available for replacing faulty groups of storage cells. In one embodiment, the redundancy component 150 is configured to record a mapping entry that maps the affected portions of the first and second groups to a spare group of storage cells for the non-volatile memory medium 122. In a further embodiment, the redundancy component 150 is configured to service a storage request for the first group and/or the second group by referencing the mapping entry and using the spare group of storage cells.

In general, in various embodiments, a mapping between a spare group of storage cells and a group that includes one or more faults may allow the faulty group to be effectively replaced by the spare or redundant group, so that storage requests for the faulty group of cells are serviced by referencing the mapping and using the spare group of cells instead of the faulty group. In some embodiments, a fault may affect multiple groups of cells. For example, a short between the last bit line of one group and the first bit line of the next group may cause errors in both groups. In some types of storage media, such a fault may be fixed by replacing both affected groups with spare groups of storage cells. However, using two spare groups of storage cells to fix a single fault may rapidly use up available spare groups. Thus, in one embodiment, determining that faults affect a portion of a first group and a portion of a second group may allow the affected portions to be replaced by (or mapped to) a single spare or redundant group of storage cells. As compared to mapping two faulty groups of storage cells to two spare groups, mapping affected portions of the two faulty groups to one spare group of storage cells may, in some embodiments, allow up to twice as many faults to be corrected with the same number of spare groups.

In one embodiment, the redundancy component 150 may comprise executable software code, such as a device driver, SML 130, or the like, stored on the computer readable storage medium 114 for execution on the processor 111. In another embodiment the redundancy component 150 may comprise logic hardware of one or more non-volatile memory devices 120, such as a non-volatile memory element 123, a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the redundancy component 150 may include a combination of both executable software code and logic hardware. In various embodiments, the redundancy module may include discrete logic structures (e.g., gates, resistors, transistors, switches, comparators, multiplexers, or the like), synthesized logic, other logic circuits, or the like.

In one embodiment, the redundancy component 150 is configured to receive storage requests from the SML 130 via a bus 125 or the like. The redundancy component 150 may be further configured to transfer data to/from the SML 130 and/or storage clients 116 via the bus 125. Accordingly, the redundancy component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the redundancy component 150 may receive storage requests as an API call from a storage client 116, as an IO-CTL command, or the like. The redundancy component 150 is described in greater detail below with regard to FIGS. 2 and 3.

According to various embodiments, a non-volatile memory controller 124 comprising the redundancy component 150 may manage one or more non-volatile memory devices 120. The non-volatile memory device(s) 120 may comprise recording, memory, and/or storage devices, such as solid-state storage device(s) and/or semiconductor storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise a device driver or SML 130, which may present a logical address space 134 to one or more storage clients 116. Alternatively or in addition, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a logical to physical address mapping structure, to map logical addresses of the logical address space 134 to media storage locations on the non-volatile memory device(s) 120. The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, semiconductor storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, 3D NAND flash memory, multiple layer Bit Cost Scalable memory (BiCS), nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), dynamic RAM (DRAM), magnetic storage media (e.g., hard disk, tape), optical storage media, or the like.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device 110 interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
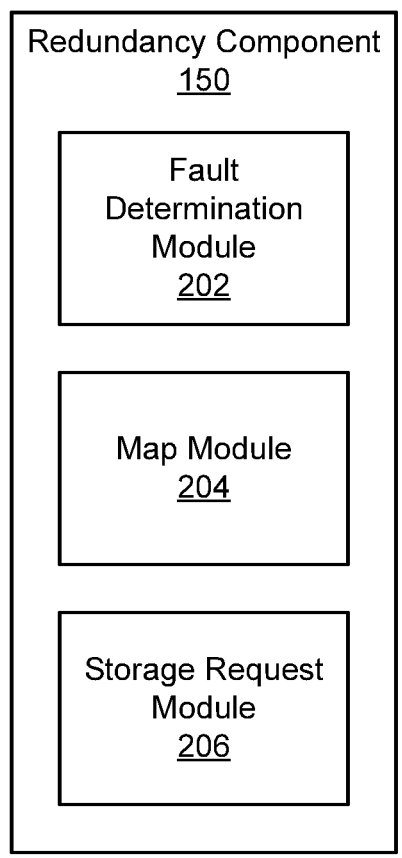
FIG. 2 is a schematic block diagram illustrating one embodiment of a redundancy component.

FIG. 2 depicts one embodiment of a redundancy component 150. The redundancy component 150 may be substantially similar to the redundancy component 150 described above with regard to FIG. 1. In general, as described above, the redundancy component 150 determines that one or more faults affect a portion of a first group of storage cells and a portion of a second group of storage cells, records a mapping entry that maps the affected portions of the first and second groups to a spare group of storage cells, and services a storage request for the first group and/or the second group by referencing the mapping entry and using the spare group of storage cells. In the depicted embodiment, the redundancy component 150 includes a fault determination module 202, a map module 204, and a storage request module 206.

In certain embodiments, a controller such as the non-volatile memory controller 124 or non-volatile memory media controller 126 may include the fault determination module 202, the map module 204, and the storage request module 206. In one embodiment, the controller may include a hardware controller, such as non-volatile memory media controller 126, for a storage device that includes the non-volatile memory medium 122. In another embodiment, the controller may include a device driver, such as SML 130, for a storage-device includes the non-volatile memory medium 122. In a further embodiment, the device driver may include logic hardware and/or executable code stored on one or more computer readable storage media.

The fault determination module 202, in one embodiment, is configured to determine that one or more faults or defects affect a portion or subset of a first group of storage cells and a portion or subset of a second group of storage cells for a non-volatile memory medium 122. In a certain embodiment, the non-volatile memory medium 122 includes a plurality of groups of storage cells. In various embodiments, a cell, a storage cell, a memory cell, or the like may be the smallest physical unit of storage or memory for non-volatile memory medium 122. For example, in Flash memory, a storage cell may be a floating gate transistor, and the charge stored on the floating gate (or the threshold voltage sufficient to make the transistor conduct when applied to the control gate) may be modified to store data. As a further example, in resistive random access memory (ReRAM), a cell may be a memristor, and the resistance of the memristor may be modified to store data. In certain embodiment, smaller logical units of data storage may exist. For example, a range for stored charge, threshold voltage, resistance, or the like may be divided into four regions such that one cell stores two bits of data. However, in further embodiments, where a cell may store more than one bit of data, the cell itself remains the smallest physical data-storing unit.

In certain embodiments, storage cells of the non-volatile memory medium are grouped together. For example, in one embodiment, a word line may refer to a contact that connects the control gates of a row of transistors (for transistor-based memory) to a driver that activates the row, or to the row of cells thus connected. In a further embodiment, a bit line may refer to a contact that connects a column of transistors (for transistor based memory) to a sense amplifier, which detects a signal representing stored data from the bit line and amplifies the signal to produce a recognizable logic level. A bit line may also refer to the column of cells thus connected. In certain embodiments, a sense amplifier may be connected to multiple bit lines. Thus, cells may be grouped together into a row or word line, a column or bit line, a set of bit lines connected to a sense amplifier, as well as a byte, a word, an error correcting code (ECC) chunk, a physical page, a logical page, a physical erase block, a logical erase block, a die, a chip, a plurality of dies or chips, or the like. In view of this disclosure, many ways to group cells together will be clear.

In one embodiment, the plurality of groups of storage cells for the non-volatile memory medium 122 includes spare or redundant groups of storage cells that are available for replacing faulty or defective groups of storage cells. For example, in one embodiment, the plurality of groups of storage cells for the non-volatile memory medium 122 may be divided into a user area and a further area referred to as a spare area, a column redundancy area, a row redundancy area, a spare block area, or the like. In a further embodiment, the size of the user area (or the number of groups of cells in the user area) may correspond to the storage capacity of the non-volatile memory medium 122, and the size of the spare area (or the number of groups of cells in the spare area) may correspond to the number of faulty groups that in the user area that can be replaced with a spare group without a reduction in storage capacity. In another embodiment, the non-volatile memory medium 122 may not be divided into a user area and a spare area, and any unused group of cells may be used as a spare or redundant group, to replace a faulty group of cells.

In various embodiments, replacing a faulty group of cells with a spare or redundant group may involve storing or recording a mapping between the faulty group and the spare group, so that storage requests for the faulty group are serviced by referencing the mapping and using the spare group. In certain embodiments, replacing a faulty group of cells no larger than the set of cells affected by the fault may use the spare capacity of the non-volatile memory medium efficiently. However, in a further embodiment, the capacity of the non-volatile memory medium 122 (or a controller) to store mappings between faulty groups and spare groups may be limited, and replacing groups at a larger granularity may more efficiently use the capacity to store such mappings.

In certain embodiments, therefore, a "group" of cells may particularly refer to a grouping or set of cells that form a single unit of redundant or spare cells for replacing other faulty groups, or to a similar grouping or set of cells that may be replaced as a unit, rather than to any arbitrary set of cells. In a further embodiment, such a group of cells may be mapped to replace faulty cells with a single mapping entry. In various embodiments, a group of cells may refer to a row or word line, a column or bit line, a set of bit lines connected to a sense amplifier, a byte, a word, an error correcting code (ECC) chunk, a physical page, a logical page, a physical erase block, a logical erase block, a die, a chip, a plurality of dies or chips, or the like, depending on the granularity at which groups of cells are replaced. Thus, a "group" refers to a pre-defined structure of cells for the non-volatile memory medium, rather than to an arbitrary region or number of storage cells. In various embodiments, such groups may be made available for replacing faulty cells by reserving spare groups in a spare area, determining that a group is unused and therefore available as a spare group, or the like. Thus, a "spare" or "redundant" group may refer to any such group that is available (or already in use) for replacing faulty cells.

In a certain embodiment, a group of cells may include a plurality of bit lines connected to one sense amplifier. In a further embodiment, each spare group (or many of the spare groups) may include the same number of bit lines connected to one sense amplifier. Thus, in one embodiment, a faulty group may be effectively replaced by replacing the output of the sense amplifier for the faulty group with the output of the sense amplifier for a corresponding spare group.

Various types of faults or defects may occur for non-volatile memory cells. In general, in various embodiments, a fault or defect may refer to any phenomenon that prevents data from being accurately stored from, or read in, one or more cells. For example, in one embodiment, a defect may be a short between a bit line and another bit line (or another voltage or contact), resulting in an inability of a sense amplifier connected to either bit line to detect correct data values. In another embodiment, where cells are floating gate transistors, an oxide layer separating the floating gate from the substrate may degrade with each program/erase cycle, resulting in charge leakage from the floating gate that prevents data from being stored correctly. In one embodiment, a fault or defect may have been created with the non-volatile memory medium. For example, a short may occur during the lithography process. In another embodiment, a fault or defect may arise over time. For example, a number of wear-related defects may be related to a number of program/erase cycles. Specific types of faults or defects that may occur may depend on the type of non-volatile memory medium 122. In various embodiments, many types of faults or defects that may occur for a non-volatile memory medium 122 will be clear in view of this disclosure.

In a certain embodiment, one or more faults that affect a portion of a first group of storage cells and a portion of a second group may include a short between a bit line of the first group and a bit line of the second group. For example, a last bit line of the first group may be shorted to a first bit line of the second group. In certain embodiments, a short between bit lines of two different groups may affect both groups. In a further embodiment, if both affected groups are replaced with spare groups, then the number of faults that can be corrected may be as small as half the number of spare groups, or half the number of mapping entries available for mapping spare groups to replace faulty groups. In a certain embodiment, however, if the fault determination module 202 determines that affected portions of two groups can be replaced with one spare group, then the number of faults that can be corrected may be equal to the number of spare groups or mapping entries.

In a further embodiment, a faulty or defective group may refer to the group of cells in which a fault occurs, or which the fault affects by preventing data from being accurately written and/or read. In some embodiments, a fault may affect a full group of cells. For example, if a group of cells is a bit line, a short in the bit line may prevent any cell in the bit line from being read, or written to. In another embodiment, a fault may affect a portion of a group of cells. For example, in a further embodiment, a group of cells may be a plurality of bit lines connected to one sense amplifier, and a short for one bit line, or between adjacent bit lines may prevent cells in affected bit lines from being read, or written to, but other bit lines in the group may be unaffected. The group may nevertheless be referred to as a faulty or defective group.

In one embodiment, a fault may affect more than one group of cells. For example, a short between the last bit line of one group of cells and the first bit line of the next group of cells may affect both groups. However, each affected group may include portions that are affected by the fault and portions that are not affected by the fault. In general, in various embodiments, a portion of a group of cells may refer to any part, subset, or fraction of the group less than the full group itself. For example, in one embodiment, a portion of a group may be half of the group, such as a first half, a second half, or the like. In another embodiment, a portion or subset of the group may be some fraction other than half of the group.

In certain embodiments, the fault determination module 202 may cooperate with the map module 204 and the storage request module 206 to replace affected portions of two groups with one spare or redundant group. In a further embodiment, more than one fault may affect portions of two groups, and the affected portions may similarly be replaced using one spare group. For example, in one embodiment, one fault may affect the last half of a first group, and another fault may affect the first half of the next group, and the two affected halves may be replaced using one redundant group.

Thus, in one embodiment, the fault determination module 202 may determine that one or more faults affect a portion of a first group of storage cells and a portion of a second group of storage cells. In a certain embodiment, determining that the one or more faults affect the affected portions may include detecting faults, by scanning for faults or defects (initially, or during use), by determining the location of cells where errors (detected or corrected by an error correcting code) persistently occur, or the like. Fault detection is described below in further detail with reference to the fault detection module 302 of FIG. 3. In another embodiment determining that the one or more faults affect the affected portions may include referencing records of previously detected faults, as described below in further detail with reference to the fault record module 304 of FIG. 3.

In a further embodiment, the fault determination module 202 may identify one or more faults, determine which groups of storage cells are affected by the identified faults, and identify affected portions or subsets of the affected groups. In one embodiment, the fault determination module 202 may refer to predefined portions or subsets of the affected groups, to determine which of the predefined portions or subsets are affected by the one or more faults. In another embodiment, the fault determination module 202 may itself define various subsets or portions of the affected groups, and determine whether those subsets or portions are affected by the faults. Defining a variety of different subsets may allow the fault determination module 202 to identify affected subsets of two groups such that both affected subsets can be replaced by one spare group.

In one embodiment, the fault determination module 202 may identify faults in more than two groups of cells, and may then identify a first group and a second group such that the faults affect a portion of the first group and a portion of the second group and the affected portions can be replaced using one spare group. In another embodiment, the fault determination module 202 may consider pairs of groups of cells in turn, identify faults that affect the pair of groups, and determine whether the faults affect a portion of the first group of the pair and a portion of the second group of the pair.

In a further embodiment, the fault determination module 202 may determine that one or more faults affect a portion of a first group of storage cells and a portion of a second group of storage cells, but that a further portion of the first group and a further portion of the second group are unaffected by the one or more faults. For example, in one embodiment, the fault determination module 202 may divide a group of cells affected by one or more faults into affected and unaffected portions.

In one embodiment, where one or more faults affect a portion of a first group of storage cells and a portion of a second group, the first group and the second group may be adjacent groups for the non-volatile memory medium 122. In various embodiments groups may be adjacent if they are physically consecutive on the non-volatile memory medium. For example, where a group includes multiple bit lines connected to one sense amplifier, adjacent groups may correspond to consecutive sense amplifiers. In another embodiment, groups may be adjacent if they are logically consecutive, such that the adjacent groups are accessed one immediately after another, accessed with the same address, or the like. In view of this disclosure, many ways for groups to be physically or logically adjacent or consecutive will be clear. In a certain embodiment, identifying portions or subsets of adjacent groups that are affected by one or more faults may allow the affected portions to be efficiently replaced. For example, in one embodiment, a mapping entry that maps the affected portions to a spare group may indicate the location of the first group, and whether or how far to shift the spare group in relation to the first group to replace the affected portions of both the first and second groups.

As a further example, in a certain embodiment, the affected first and second groups of storage cells may be adjacent, such that the second group physically or logically follows immediately after the first group. In a further embodiment, each group may be divided into halves such that second half of a group physically or logically follows immediately after the first half of the group, and so that the first half of the second group similarly follows after the second half of the first group. In some embodiments, then, the fault determination module 202 may determine that the second half of the first group and the first half of the second group are affected by one or more faults. Thus, in a further embodiment, the affected halves may form a physically or logically contiguous region the size of one group. In another embodiment, the affected portions may not both be halves of the affected groups, but may similarly form a physically or logically contiguous region the size of one group. For example, in one embodiment, the last two thirds of one group may be affected by faults, as well as the first third of the next adjacent group. In a further embodiment, a physically or logically contiguous region the size of one group may be replaced by a spare group using one mapping entry that describes the contiguous region to be replaced.

The map module 204, in one embodiment, is configured to record a mapping entry that maps the affected portions, subsets, or halves of the first and second groups, as determined by the fault determination module 202, to a spare or redundant group of storage cells for the non-volatile memory medium 122. For example, in one embodiment, the map module 204 may store a mapping between the affected subsets of the first and second groups and a redundant group.

As used herein, to "map" refers to creating or storing an association between a spare or redundant group of storage cells and another group, or portions of groups of storage cells replaced by the spare or redundant group. A "mapping entry" or "mapping" refers to a table entry, list entry, other datum, or the like, that records the association, or to the collection of data that records such associations. A mapping or mapping entry may thus be referred to as mapping a faulty group or affected portions of groups to a spare group, mapping the spare group to the faulty group or affected portions of groups, or mapping between the spare group and the faulty group or affected portions of groups.

In various embodiments, the map module 204 may store a mapping or record a mapping entry by storing the data of the mapping or mapping entry in a mapping table, a list of mapping entries, or the like. In a further embodiment, hardware for the non-volatile memory device 120 or non-volatile memory media 122 may be reserved for the map module 204 to store mapping entries, a mapping table, or the like. For example, in a certain embodiment, hardware such as latches, data registers, or the like may be reserved for storing mapping table entries, so that each spare or redundant group for the non-volatile memory medium may be associated with a mapping entry. In another embodiment, a region of volatile or non-volatile memory may be reserved for storing a mapping table where each row or entry of the table indicates a spare group and an associated group, or portions of groups. In some embodiments, the map module 204 may store mapping entries in working volatile memory of a controller, such as non-volatile memory media controller 126, or a driver, such as SML 130, and may separately preserve the mapping entries to non-volatile memory. In view of this disclosure, many ways for a map module 204 to store or record a mapping or a mapping entry are clear.

In one embodiment, the map module 204 may initialize, erase, or store a default value for a mapping entry associated with a spare group, indicating that the spare group is not mapped to any other group or portions of groups. In another embodiment, the map module 204 may store an address or other identifier of a group of storage cells in the mapping entry for a spare group, indicating that the spare group is mapped to that group of storage cells. In certain embodiments, where the map module 204 maps one spare group to one faulty or defective group, the spare group may be referred to as an "unshifted" spare group. In another embodiment, the map module 204 may store more than one address or other identifier in a mapping entry for a spare group, to identify portions of groups that are replaced by the spare group. Information of a mapping entry that indicates or identifies a group, or portions of groups, associated with a spare group may be referred to herein as "group information." In one embodiment, group information may include an address associated with a group of storage cells. In another embodiment, an address (e.g. an address used for a storage request) may refer to a storage region that includes multiple groups of storage cells, and the group information may include an address for the region that includes the group, and a further identifier of the group within that address (e.g., a sense amplifier for the group of storage cells). In view of this disclosure, many types of group information are clear that a map module 204 could use to identify a group of storage cells.

In one embodiment, the map module 204 may store group information in a mapping entry that explicitly indicates portions of groups that are replaced by the spare group. For example, the map module 204 may identify a portion of a group by identifying the group and the boundaries of the portion, the size of the portion and an offset within the group, an offset alone if the size of the portion is known in advance (e.g., if consistent sizes are used when identifying portions of groups), or the like. However, providing space to identify two portions of groups may increase the size of a mapping entry by a factor of two or more compared to recording group information indicating one group, and may correspondingly increase the amount of hardware used to store the mapping entries. Thus, in one embodiment, as described above, where the fault determination module 202 determines that a portion of a first group and a portion of a second group are affected by one or more faults, where the first group and the second group are adjacent so that the affected portions form a contiguous region the size of one group, the map module 204 may record a mapping entry that indicates one of the adjacent affected groups and an offset or shift indicating where the contiguous region begins or ends. In certain embodiments, where the map module 204 maps one spare group of storage cells to a contiguous region the size of one group, formed of portions of more than one group of storage cells, the spare group may be referred to as a "shifted" spare group. Information of a mapping entry that indicates or identifies an offset or shift indicating where a contiguous region, to which a spare group is mapped, begins or ends may be referred to as "shift information." In one embodiment, an offset or shift of zero (or omitting shift information from the mapping entry) may indicate that a spare group is an unshifted spare group, where the unshifted spare group is mapped to replace a single group of storage cells. In another embodiment, a shift or offset may indicate a distance (e.g. a number of columns, number of bit lines, number of storage cells, a predetermined shift distance, or the like), from the boundary of a first group of cells to the boundary of a contiguous region replaced by the spare group, so that the shifted spare group replaces fault-affected portions of both the first group of cells and an adjacent group of cells.

Thus, in one embodiment, where the fault determination module 202 determines that a portion of a first group and a portion of a second group are affected by one or more faults, a mapping entry recorded by the map module 204 may include group information indicating the first group or the second group, and shift information indicating that a mapping between the indicated group and the spare group is shifted (i.e., that the spare group is shifted), so that the affected portions of the first and second groups are mapped to the spare group. For example, in one embodiment, the affected portions may be the last half of the first group and the first half of the second group. In a further embodiment, the group information may identify the first group, and the shift information may identify a forward offset of one half the group size, so that the spare group is mapped to the second half of the first group, and the first half of the next group. In another embodiment, the group information may identify the second group, and the shift information may identify a reverse offset of one half the group size, so that the spare group is mapped to the first half of the second group, and the second half of the first group.

In a further embodiment, the shift information for a mapping entry may indicate a zero, blank, or default value, indicating that the spare group is an unshifted spare group. In another embodiment, the shift information may indicate the magnitude of a shift. For example, in a certain embodiment, a group may include eight bit lines connected to a common sense amplifier, and the fault determination module 202 may determine that faults affect the last three bit lines of one group and the first five bit lines of the next group. In a further embodiment, the map module 204 may record a mapping entry with group information identifying the first group, and shift information indicating a forward shift of five bit lines, so that the spare group is mapped to the last three bit lines of the first group and the first five bit lines of the next group.

In another embodiment, the shift information may indicate whether a predefined shift is applied. For example, in one embodiment, the map module 204 may record a mapping entry with a single bit of shift information, where a binary zero in the shift bit indicates that the spare group is unshifted, and a binary one indicates that the spare group is shifted by a predefined distance of half the group size, so that the spare group is mapped to the second half of one group, and the first half of the next group. In a certain embodiment, a map module 204 that records mapping entries using group information that identifies one group, and a single bit of shift information to indicate that the mapping is shifted so that the spare group covers affected portions of two other groups, may provide the flexibility of allowing a spare group to cover affected portions of two groups by adding one bit to the size of mapping entries that would otherwise be recorded. In another embodiment, the map module 204 may use shift information to indicate whether one or more predefined shifts, of various sizes are applied. Various types of shift information that a map module 204 may use to indicate that a mapping is shifted to cover affected portions of two groups will be clear in view of this disclosure.

The storage request module 206, in one embodiment, is configured to service a storage request for the first group and/or the second group identified by the fault determination module 202, by referencing the mapping or mapping entry recorded or stored by the map module 204, and using the spare group of storage cells. In one embodiment, a storage request may include any request to read, write, modify, or otherwise access data of the non-volatile memory medium 122. For example, in certain embodiments, a storage request may be received from a client 116 via an interface such as interfaces 121, 132, 133 of FIG. 1. In another embodiment, a storage request may be transmitted via a bus such as bus 125. In one embodiment, the redundancy component 150 or the storage request module 206 may receive storage requests. In another embodiment, the redundancy component 150 or the storage request module may service storage requests received by another module, by the non-volatile memory media controller, or the like.

In one embodiment, the storage request module 206 may service a storage request by reading, writing, modifying, or otherwise accessing data of the non-volatile memory medium 122 in response to the storage request. For example, in one embodiment, a storage request may be a read request, and the storage request module 206 may service the read request by reading data from the non-volatile memory medium 122. In another embodiment, a storage request may be a write request, and the storage request module 206 may service the write request by writing data to the non-volatile memory medium 122. In view of this disclosure, many types of storage requests and ways to service storage requests will be clear.

As used herein, a storage request is "for" a group of cells if, absent any mapping from the map module 204, or faults identified by the fault determination module 202, servicing the storage request would result in reading, writing, modifying, or otherwise accessing data of the group of cells. For example, in one embodiment, a storage request may include an address or a range of addresses indicating the data to access, and one address may correspond to one group of storage cells. In another embodiment, an address may correspond to multiple groups of storage cells, and the request specifying that address may be said to be for those multiple groups. In certain embodiments, in the absence of faults affecting the requested group(s), or of any mapping recorded by the map module 204 that maps a spare group to one or more of the requested groups, a storage request module 206 may service a storage request by accessing data of the group or groups that the storage request is for.

However, in certain embodiments, as described above, the fault determination module 202 may determine that one or more faults affect a portion of a first group of storage cells and a portion of a second group, and the map module 204 may record a mapping entry that maps the affected portions of the first and second groups to one of the spare groups (e.g., a shifted spare group) for the non-volatile memory medium 122. In another embodiment, the fault determination module 202 may determine that one or more faults affect one group, and the map module 204 may record a mapping entry that maps the affected group to one of the spare groups (e.g., an unshifted spare group). Where a fault affects a group of storage cells, servicing a storage request for the affected group by using the affected group (rather than the appropriate spare group) may result in reading incorrect data, losing data that is written to faulty cells, an inability to read or write data to the group, or the like. Thus, in a certain embodiment, the storage request module 206 may service storage requests by referencing the mapping entries stored or recorded by the map module 204.

In certain embodiment, "referencing" a mapping entry may include reading the mapping entry, comparing information in the mapping entry to information of a storage request, or the like. For example, in one embodiment, the storage request module 206 may receive a storage request with an address (or range of addresses) that corresponds to one or more groups of storage cells. In a further embodiment, the storage request module 206 may reference the mapping entries by comparing the address, or range of addresses, for the storage request to the group information recorded by the mapping entries. If the address does not match the mapping entries, then the storage request module 206 may service the storage request using the data of the groups indicated by the address or the range of addresses. If the address does match one of the mapping entries, then the spare group corresponding to that mapping entry is mapped to replace at least a portion of one of the requested groups, and the storage request module 206 may service the storage request using the spare group of storage cells (e.g., by reading, writing, modifying, or otherwise accessing the data stored by the spare group.)

In one embodiment, a spare group may be an "unshifted" spare group, as described above, that is mapped to replace one group of storage cells, and the storage request module 206 may service a storage request for that group by referencing the mapping and using the data of the spare group instead of data of the requested group. In another embodiment, a spare group may be mapped to replace portions of a first group and a second group affected by one or more faults (e.g., the spare group may be a "shifted" spare group as described above), and the storage request module 206 may service a storage request for the first group and/or the second group by referencing the mapping and using data of the spare group instead of data of the affected portions.

As a further example, in one embodiment, the fault determination module 202 may determine that one or more faults affect a portion of a first group of storage cells and a portion of a second group, and map module 204 may record a mapping entry that maps a spare group to the affected portions of the first and second groups. In a further embodiment, a further portion of the first group and a further portion of the second group may be unaffected by the one or more faults identified by the fault determination module 202. (If portions to which a spare group is not mapped are also affected by faults, it may be more efficient, in certain embodiments, to map two spare groups to replace both faulty groups, instead of mapping one spare group to replace portions of two faulty groups). Thus, in one embodiment, the storage request module 206 may service a request for the first group and/or the second group using the spare group (in place of the affected portions) and using at least one of the unaffected portions. For example, in a further embodiment, the storage request module 206 may service a read request for a group that includes an affected and an unaffected portion by reading data from the unaffected portion, and reading data from the mapped spare group instead of data from the affected portions. In view of this disclosure, many ways are clear of using a storage request module 206 to service a storage request by referencing one or more mapping entries and using one or more spare groups of cells.

In a certain embodiment, portions of two groups of storage cells, mapped to one spare group by the map module 204, may be accessed by a single storage request. For example, in one embodiment, a storage request may include an address that corresponds to multiple groups, and both groups that have a portion mapped to one spare group may be included in the address for the storage request. In a further embodiment, the storage request module 206 may reference the mapping entries by making one comparison to the requested address for one mapping entry. In some embodiments, because both groups with portions mapped to a spare group are accessed at the same time, by the same address, or the like, one comparison by the storage request module 206 may determine whether a mapping entry matches an address, even if the mapping entry includes group information for one of the groups and not the other (with shift information indicating that the spare area is actually mapped to portions of two groups, rather than the one indicated group). In another embodiment, if two groups with portions mapped to a spare group are accessed separately (e.g., using different addresses) the storage request module 206 may reference the mapping entries by making two comparisons to the requested address for one mapping entry, to determine if either group is requested. Thus, in certain embodiments, portions of two groups that are adjacent, or are otherwise accessed together, may be mapped to one spare group to reduce (or avoid increasing) the number of comparisons performed by the storage request module 206.

Figure 3:
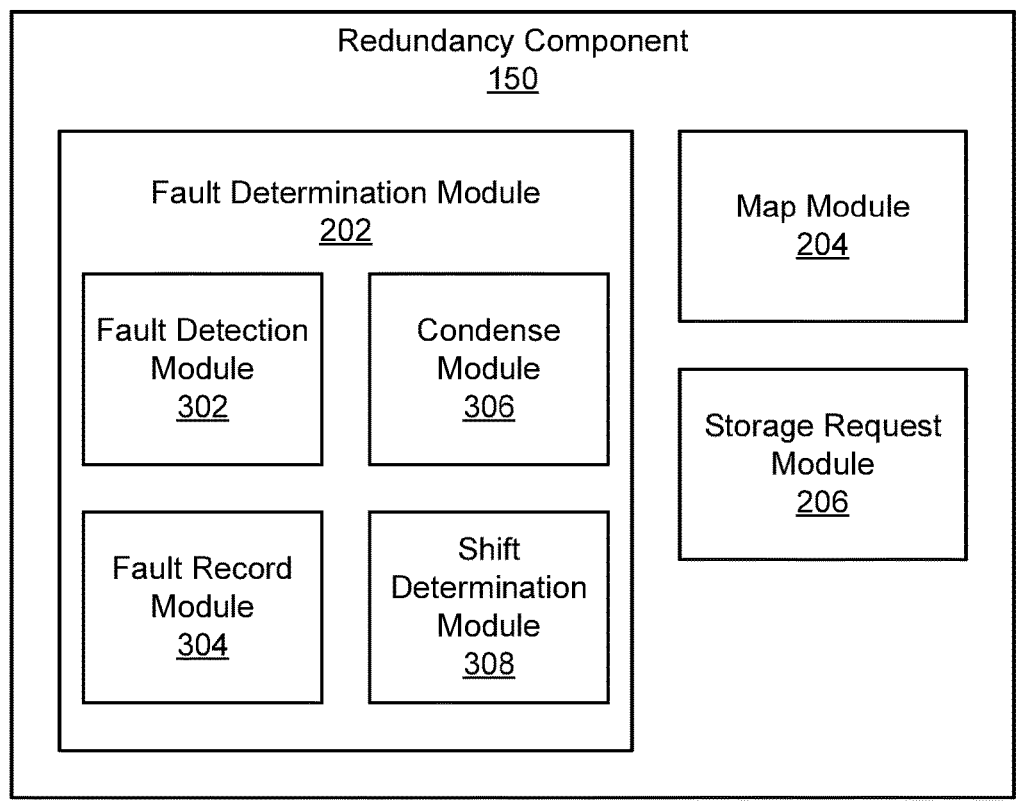
FIG. 3 is a schematic block diagram illustrating another embodiment of a redundancy component.

FIG. 3 depicts another embodiment of a redundancy component 150. The redundancy component 150, in certain embodiments, may be substantially similar to the redundancy component 150 described above with regard to FIG. 1 and/or FIG. 2. In the depicted embodiment, the redundancy component 150 includes a fault determination module 202, a map module 204, and a storage request module 206, which may be substantially as described above with regard to FIG. 2. The fault determination module 202, in the depicted embodiment, includes a fault detection module 302, a fault record module 304, a condense module 306 and a shift determination module 308.

In one embodiment, the fault determination module 202 may use the fault detection module 302 to determine that one or more faults or defects affect portions or subsets of a first group and a second group by detecting at least one of the one or more defects. In various embodiments, the fault detection module 302 may detect faults or defects that affect groups of storage cells. For example, in one embodiment, the fault detection module 302 may scan for faults by writing test data to groups of storage cells and reading the test data to identify changes that may be caused by faults or defects. For example, in one embodiment, a bit line short may result in a binary one being consistently read from the affected bit line, so writing a zero to the bit line and reading a one may indicate the presence of a fault affecting the bit line. In a further embodiment, some errors may occur randomly as a result of voltage drift, disturbances from programming or erasing nearby cells, or the like, and a single error may or may not indicate the presence of a fault. However, in a certain embodiment, the fault detection module 302 may can groups of cells multiple times, and determine that a fault exists if an error consistently occurs. In certain embodiments, the fault detection module 302 may scan for faults when the non-volatile memory medium 122 is initially made available for data storage, after a predefined number of program/erase cycles, or the like. In one embodiment, the fault detection module 302 may scan already-empty or erased groups of storage cells for faults. In another embodiment, the fault detection module 302 may cooperate with a garbage collector, groomer, or the like, to move data off of non-empty blocks, in order to scan the blocks for faults.

In another embodiment, the fault detection module 302 may identify faults based on errors that occur in user data, metadata, or the like. For example, in one embodiment, the fault detection module 302 may cooperate with an apparatus or module that detects and/or corrects data errors using an error correcting code. In a further embodiment, if errors consistently occur for a group of storage cells, or a portion or subset of such a group, the fault detection module 302 may determine that the group, portion, or subset is affected by one or more faults. In view of this disclosure, many ways of configuring a fault detection module 302 to detect faults will be clear.

In one embodiment, the fault determination module 202 may use the fault record module 304 to determine that one or more faults or defects affect portions or subsets of a first group and a second group by referencing a record of previously-detected faults or defects. In one embodiment, the fault record module 304 may receive a record of faults detected by a manufacturer of the non-volatile memory medium 122. In another embodiment, the fault record module 304 may create, or add to, a record of faults by recording faults or defects detected by the fault detection module 302.

In one embodiment, the fault record module 304 may store a record of previously-detected faults on the non-volatile memory device 120. In a certain embodiment, the fault record module 304 may store a record of previously-detected faults using dedicated hardware of the non-volatile memory medium 122. For example, in one embodiment, a bit line of the non-volatile memory medium 122 may be associated with a latch, a register, or the like, that stores a value indicating whether that bit line is faulty or defective. In another embodiment, the fault record module 304 may store a record of previously-detected faults separately from the non-volatile memory device. In view of this disclosure, many ways for a fault record module 304 to record or store previously-detected faults will be clear.

In a further embodiment, the fault record module 304 may read from, or reference the record of previously detected faults as part of the fault determination module 202 determining that faults affect portions of a first group and a second group. For example, the fault determination module 202 may select a first group and a second group, and identify portions within those groups (e.g., halves of the groups), and the fault record module 304 may reference the previously detected faults to indicate which portions or subsets of the two groups are affected by faults.

In one embodiment, the fault determination module 202 may determine that one or more faults affect certain arrays of storage cells (e.g., individual bit lines or the like) by using the fault detection module 302 or the fault record module 304, and the condense module 306 may condense information about those arrays of cells to identify which groups, or portions or subsets of groups, are affected by faults. For example, in one embodiment, two groups may both include a plurality of sets of bit lines, and the fault determination module 202 may determine which bit lines are affected by faults. In a further embodiment, the condense module 306 may condense information about the bit lines to identify which sets of bit lines are affected by the one or more faults. In one embodiment, an affected portion of the first or second group may then be an affected set of bit lines, and an unaffected portion may be an unaffected set of bit lines.

In one embodiment, the condense module 306 may condense information about arrays of cells such as bit lines by using one or more logic operations, logic gates, or the like. For example, in a certain embodiment, latches associated with bit lines may store a zero if the associated bit line is not affected by a fault, and a one if the associated bit line is affected by a fault. In a further embodiment, the condense module 306 may identify sets of bit lines as portions of groups, and use an OR operation, logic gate, or the like, to merge or condense the values stored by latches associated with the bit lines in one set of bit lines, so that the output of the OR operation is a zero if the bit lines in the set are not affected by a fault, and a one if one or more of the bit lines in the set are affected by a fault. In another embodiment, the condense module 306 may use an AND operation, logic gate, or the like to condense information about bit lines where a one indicates no fault and a zero indicates a fault. In yet another embodiment, the condense module 306 may set a value on a bus or data line to an initial value that indicates no fault, and connect that bus or data line to hardware storing information about a number of bit lines, one after the other, in such a way that the value of the bus will be changed to indicate a fault if the information indicates that any of the bit lines is affected by a fault. In view of this disclosure, many ways will be clear for a condense module 306 to merge or condense information about bit lines or other arrays of storage cells.

In one embodiment, the fault determination module 202 may identify faults or defects affecting two groups of storage cells, and may use a shift determination module 308 to determine whether one shifted spare group can cover the affected portions of the two groups (e.g., whether the shifted spare group can be mapped to affected portions in such a way that portions to which the spare group is not mapped are not affected by the faults). For example, in one embodiment, the fault determination module 202 may identify faults in two adjacent groups, and identify halves of the groups to further specify the location of the faults. In one embodiment, the faults may affect the second half of the first group and the first half of the second group, and the shift determination module 308 may determine that one shifted spare group, shifted by half the size of the groups, can cover the affected portions. In another embodiment, however, the faults may affect a first half of the first group, and the shift determination module 308 may determine that a shifted spare group will not cover the fault in the first half of the first group.

As another example, in one embodiment, two adjacent groups may both include eight bit lines, and a fault may affect the last three bit lines of the first group and the first five bit lines of the second group. In a further embodiment, a spare group may similarly include eight bit lines, and the shift determination module 308 may determine that a shifted spare group, shifted by five bit lines, can cover the affected portions. In another embodiment, however, faults may affect a region larger than eight bit lines, or more than one fault may be more than eight bit lines apart, and the shift determination module 308 may determine that one shifted spare group will not cover the faults in the two groups.

In a certain embodiment, the shift determination module 308 provides group information and/or shift information to the map module 204. For example, in one embodiment, the shift determination module 308 may determine that one shifted spare group can correct faults in affected portions of two groups (with unaffected portions of the two groups not mapped to the spare group), and may provide the map module 204 with group information identifying one of the groups, and shift information indicating that a shifted spare group is mapped to the affected portions, and the map module 204 may create the corresponding mapping entry. In another embodiment, the shift determination module 308 may determine that a shifted spare group does not correct faults in the two groups, and may provide the map module 204 with group information identifying both of the groups, and shift information indicating that unshifted spare groups are mapped to each group, and the map module 204 may create two corresponding mapping entries. In view of this disclosure, many ways of determining whether a shifted spare group covers faults in two groups will be clear.

Figure 4A:
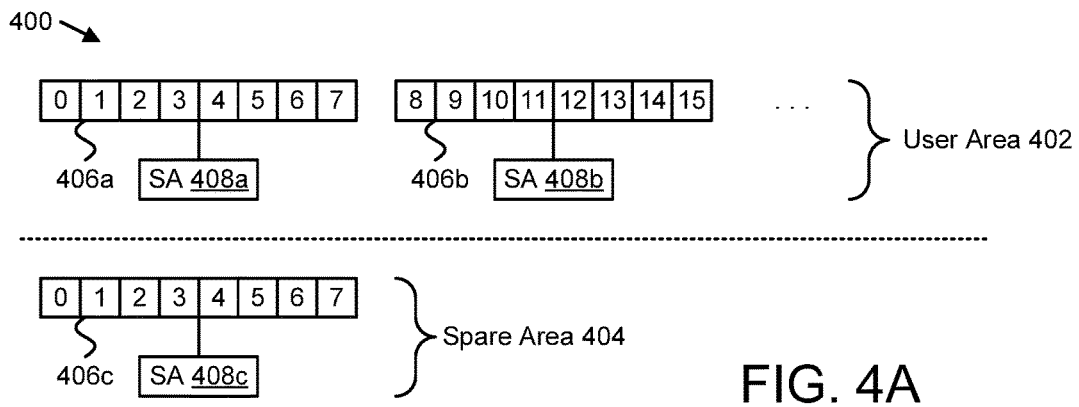
FIG. 4A is a schematic block diagram illustrating one embodiment of a non-volatile memory medium comprising a user area and a spare area.
Figure 4B:
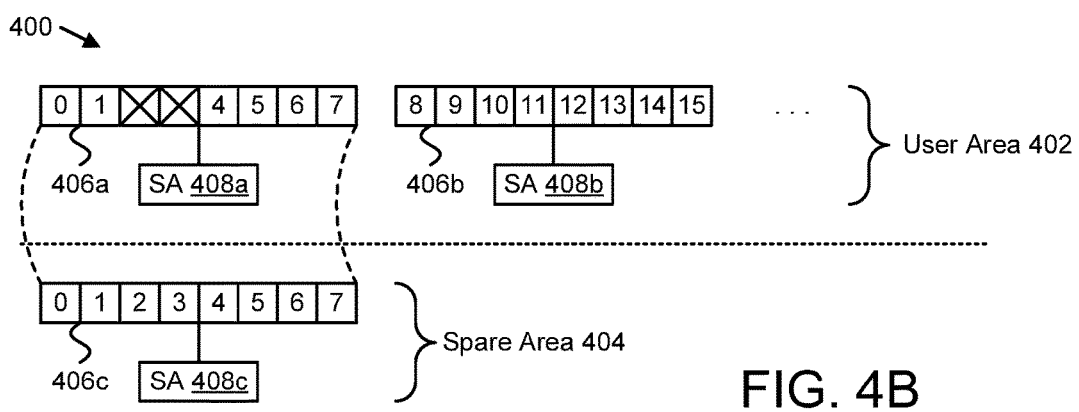
FIG. 4B is a schematic block diagram illustrating the non-volatile memory medium of FIG. 4A with an unshifted spare group in use.
Figure 4C:
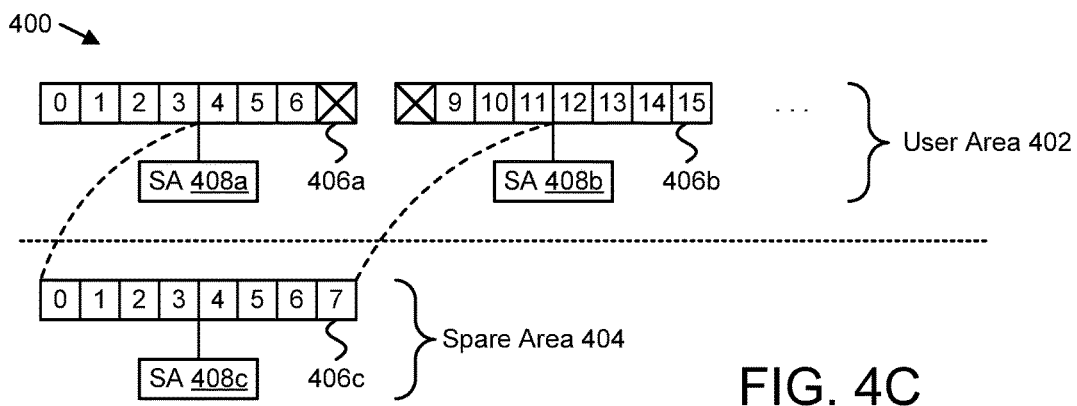
FIG. 4C is a schematic block diagram illustrating the non-volatile memory medium of FIG. 4A with a shifted spare group in use.

FIGS. 4A, 4B, and 4C depict embodiments of a non-volatile memory medium 400. In one embodiment, the non-volatile memory medium 400 may be substantially similar to the non-volatile memory medium 122 described above with regard to FIG. 1. In the depicted embodiment, the non-volatile memory medium 400 includes bit lines 406 that connect columns of storage cells to sense amplifiers 408. In various embodiments, sense amplifiers 408 may detect signals representing stored data from the bit lines 406, and amplify the signal to produce a recognizable logic level. In certain embodiments, the sense amplifiers 408 may include transistors, resistors, differential amplifiers, or the like. In the depicted embodiment, groups of storage cells include a plurality of bit lines 406 connected to one sense amplifier 408, so that the bit lines 406a form one group of cells connected to sense amplifier 408a, bit lines 406b form another group of cells connected to sense amplifier 408*b*, and so on. In addition, in the depicted embodiment, the non-volatile memory medium 400 includes a user area 402 and a spare area 404. In general, in various embodiments, groups of cells in the user area 402 contribute to the storage capacity of the non-volatile memory medium 400, and groups of cells in the spare area 404 are available for replacing faulty groups of cells in the user area 402.

Two groups of cells (bit lines 406*a*, 406*b*) are depicted in the user area 402 for convenience in depiction; however a user area 402 may include many groups of cells. Similarly, a spare area 404 may include many spare groups of cells, but one spare group (bit lines 406*c*) is depicted. The bit lines 406 are also individually numbered in the Figures for convenience in describing where faults may occur. Faults that affect a bit line 406 are indicated by the bit line 406 being crossed out rather than numbered.

In one embodiment, as depicted in FIG. 4A, groups of cells in the user area 402 may not be affected by faults. Thus, in FIG. 4A, no faults are indicated (no bit lines 406 are crossed out). Without faults affecting the groups of cells, the groups of cells in the user area 402 may be used to service storage requests without using a spare group of cells from the spare area 404.

In another embodiment, as depicted in FIGS. 4B and 4C, faults may affect one or more groups of cells in the user are 402. Thus, in FIGS. 4B and 4C, bit lines 406 affected by faults are crossed out. In FIG. 4B, a short between bit lines 406 has affected bit lines 2 and 3, in the first group of cells of the user area 402 (bit lines 406*a*). The fault determination module 202 may identify that the first group of cells is affected. In the depicted embodiment, a spare group of storage cells (bit lines 406*c*) from the spare area 404 is mapped to the first group of cells of the user area 402 (bit lines 406*a*), as indicated by dashed lines, so that storage requests for the first group of cells are serviced using the spare group. Because the spare group is mapped to one group of cells in the user area 402, it is an unshifted spare group. Thus, in the depicted embodiment, the first bit line 406 of the spare group replaces the first bit line 406 of the first group of cells in the user area 402, the second bit line 406 of the spare group 406 replaces the second bit line 406 of the first group of cells in the user area 402, and so on. In another embodiment, if affected bit lines 406 were in the second group of cells of the user area 402 (bit lines 406*b*), an unshifted spare group could replace the second group of cells, with the first bit line of the spare group replacing the first bit line of the second group of cells, the second bit line replacing the second bit line, and so on.

Accordingly, in various embodiments, the first bit line of an unshifted spare group may be mapped to the first bit line of the group it replaces: bit line 0 if the replaced group is the first group of bit lines 406*a* in the user area 402, bit line 8 if the replaced group is the second group of bit lines 406*b* in the user area 402, and so on for further groups of cells in the user area 402. By contrast, in another embodiment, a shifted spare group may be mapped to replace a region that is offset from boundaries of the groups of cells in the user area 402, and the first bit line of the shifted spare group may replace a bit line other than the first bit line of a group in the user area 402.

In one embodiment, the first and second groups of cells in the user area 402 may have different addresses, and a mapping entry for an unshifted spare group may record the association between the spare group and the address for any of the groups in the user area. In another embodiment, one address may include multiple groups of cells in the user area 402, and a mapping entry for an unshifted spare group may indicate that the spare group is mapped to one of the groups of cells for that address, indicating the particular group by an additional identifier such as an identifier of the sense amplifier 408 for a group of cells.

In another embodiment, as depicted in FIG. 4C, one or more faults may affect more than one group of cells. For example, in FIG. 4C, a short between bit lines 406 has affected bit line 7, in the first group of cells of the user area 402 (bit lines 406*a*), and bit line 8, in the second group of cells of the user area 402 (bit lines 406*b*). The fault determination module 202 may identify that the second half of the first group of cells and the first half of the second group of cells are both affected by the short. In the depicted embodiment, a spare group of storage cells (bit lines 406*c*) from the spare area 404 is mapped to the second half of the first group of cells and the first half of the second group of cells in the user area 402, as indicated by dashed lines, so that storage requests for the affected halves of both groups are serviced using the spare group, and storage requests for the unaffected halves are serviced without using the spare group. Because the spare group is mapped to a contiguous region the size of one group, formed of portions of more than one group of storage cells, it is a shifted spare group. For example, in a certain embodiment, a mapping entry for the shifted spare group may include group information indicating that the replaced region begins in the first group of cells (bit lines 406*a*), as well as shift information indicating a shift of four bit lines, so that the shifted spare group replaces the last four bit lines of the first group of cells, and the first four bit lines of the second group of cells in the user area 402. Equivalently, in another embodiment, a mapping entry may indicate an initial association between the shifted spare group and the second group of cells (bit lines 406*b*), as well as shift information indicating a leftward shift of four bit lines. Thus, one fault may be corrected with one shifted spare group, instead of by using two unshifted spare groups to replace both affected groups of cells in the user area 402.

Figure 5A:
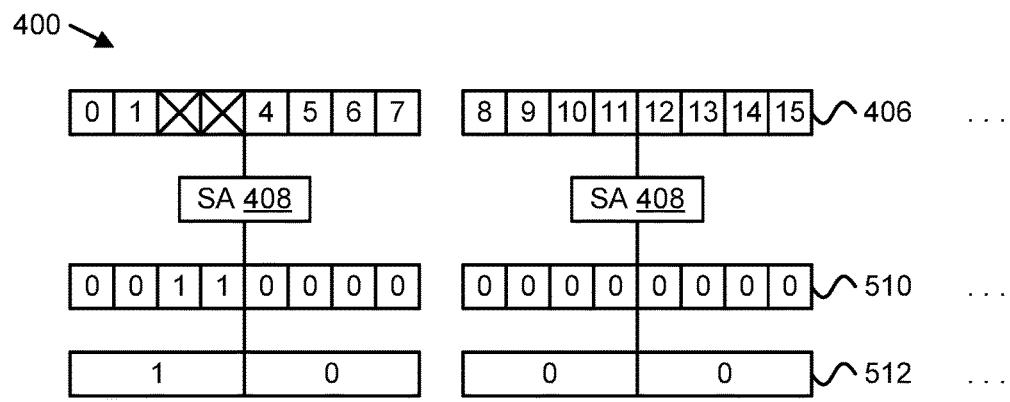
FIG. 5A is a schematic block diagram illustrating the non-volatile memory medium of FIG. 4A with condensed information about bit lines affected by faults, in one embodiment.
Figure 5B:
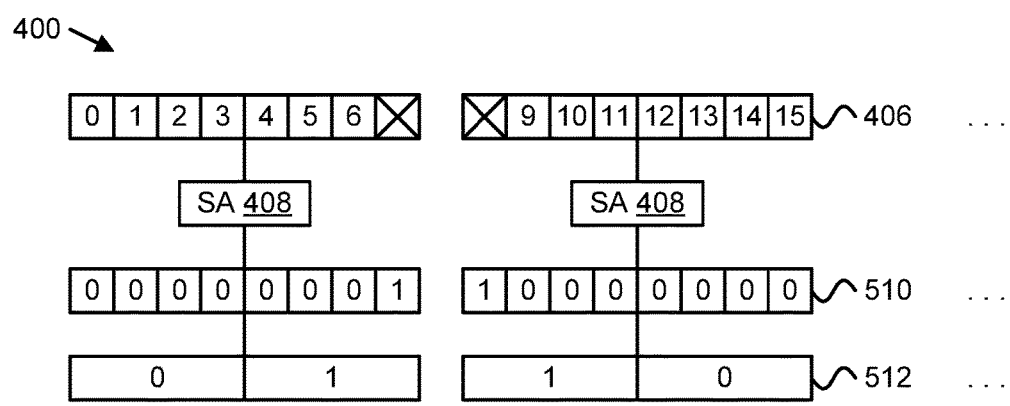
FIG. 5B is a schematic block diagram illustrating the non-volatile memory medium of FIG. 4A with condensed information about bit lines affected by faults, in another embodiment.

FIGS. 5A and 5B depict embodiments of the non-volatile memory medium 400 of FIGS. 4A, 4B, and 4C, with condensed information about bit lines affected by faults. As described above, groups of cells may include multiple bit lines 406 with one sense amplifier 408 per group of cells. In the depicted embodiment, data registers 510 are associated with the bit lines 406 so that a data register 510 indicates whether the bit line is affected by a fault. In a certain embodiment, the fault detection module 302 may set the values in the data registers 510 when a fault is detected, and the fault record module 304 may reference the data registers 510 to determine whether a fault affects a portion of a group of cells. In one embodiment, additional shared data registers 512 may be coupled to the data registers 510 and to a bus or data line for accessing the information in the shared data registers 512. In various embodiments, a data register 510 or a shared data register 512 may include a static latch, an edge-triggered flip-flop, other logic circuits, gates, transistors, or the like. In a certain embodiment, the condense module 306 may use the shared data registers 512 to condense information about the bit lines 406, from the associated data registers 510, to identify which sets of bit lines 406 are affected by the one or more faults.

For example, in the depicted embodiment, each group of cells includes a first set of four bit lines 406 and a second set of four bit lines 406. In FIG. 5A, as in FIG. 4B, a fault affects bit lines 2 and 3, in the first group of cells. Thus, the data registers 510 associated with bit lines 2 and 3 store a one, indicating that those bit lines are affected by a fault, and the remaining data registers 510 store a zero, indicating that those bit lines are not affected by the fault. The shared registers 512 include condensed data from sets of four bit lines, so the first shared register 512 (for bit lines 0-3) stores a 1, indicating that at least one of those bit lines is affected by a fault, and the remaining shared registers 512 (for bit lines 4-7, 8-11, and 12-15) store a zero, indicating that the remaining sets of bit lines are not affected by faults. Thus, by inspection of the shared registers 512, the fault determination module 202 may determine that only a portion of one group is affected by the fault.

In FIG. 5B, as in FIG. 4C, a fault affects bit line 7, in the first group of cells, and bit line 8, in the second group of cells. Thus, the data registers 510 associated with bit lines 7 and 8 store a one, indicating that those bit lines are affected by a fault, and the remaining data registers 510 store a zero, indicating that those bit lines are not affected by the fault. The shared registers 512 include condensed data from sets of four bit lines, so the second and third shared registers 512 (for bit lines 4-7 and 8-11, respectively) store a 1, indicating that at least one of the bit lines in both of those sets is affected by a fault, and the remaining shared registers 512 (for bit lines 0-3 and 12-15) store a zero, indicating that the remaining sets of bit lines are not affected by faults. Thus, by inspection of the shared registers 512, the fault determination module 202 may determine that the second portion of the first group and the first portion of the second group are affected by faults.

In a certain embodiment, a 0, 1, 1, 0 result in the shared data registers 512 for two groups of cells may indicate that faults affecting both groups of cells affect portions of the two groups that can be mapped to one shifted spare group. In a further embodiment, a result other than 0, 1, 1, 0 in the shared data registers 512 may indicate that faults affect one of the groups, so that an unshifted spare group can be mapped to the affected groups, or that faults affect portions of both groups in a way that will not be wholly corrected by mapping a shifted spare group to portions of the affected group, and two unshifted spare groups may be mapped to the two affected groups. Thus, in a certain embodiment, the fault determination module 202 may traverse consecutive pairs of groups of cells and reference the result in the shared data registers 512.

Figure 6:
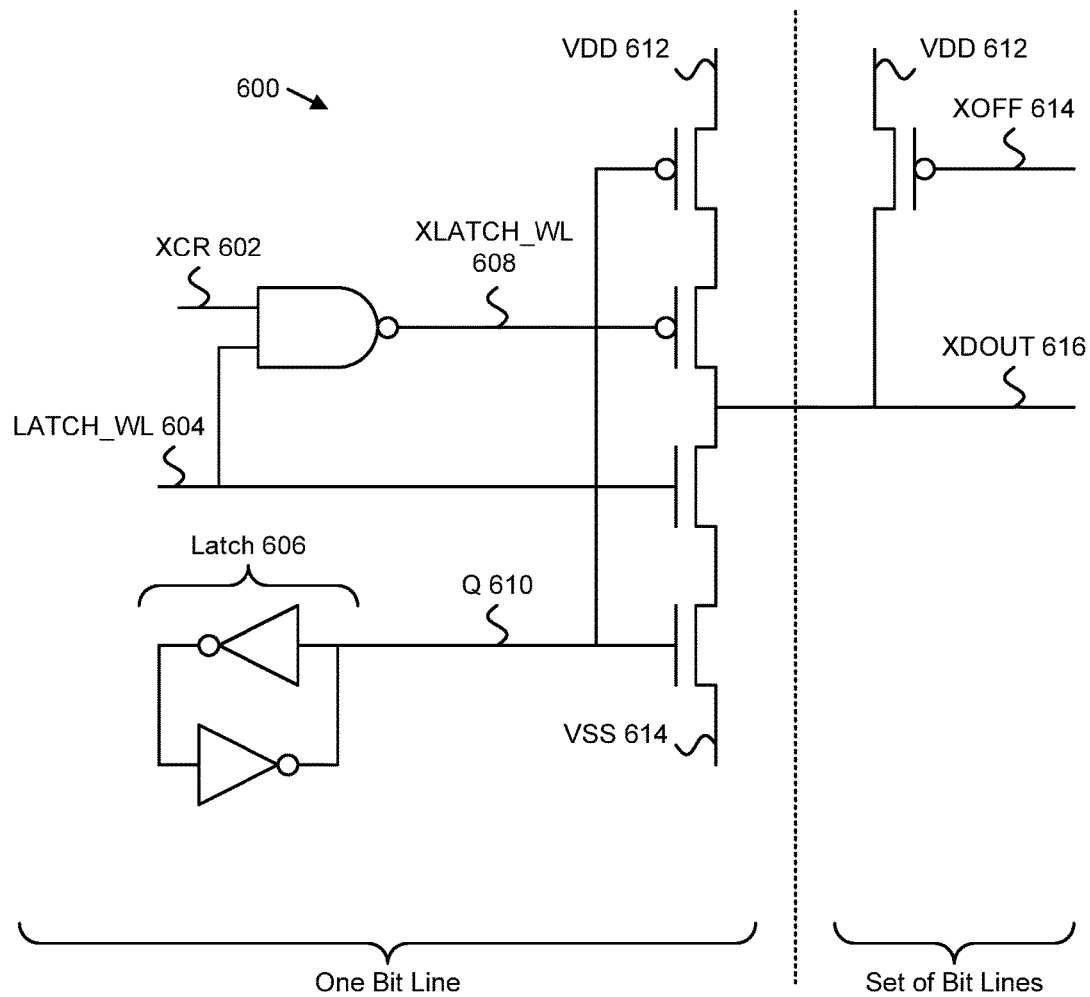
FIG. 6 is a circuit diagram illustrating one embodiment of an apparatus for condensing information about bit lines affected by faults.

FIG. 6 depicts one embodiment of an apparatus 600 for condensing information about bit lines affected by faults. In the depicted embodiment, the structure to the right of the dotted line transmits condensed information about bit lines affected by faults, for a set of bit lines. The XDOUT line 616 connects to a data bus, to one of the shared registers 512 of FIGS. 5A and 5B, or the like, and outputs a binary one if the bit lines in the set of bit lines are not affected by faults, or a zero if at least one of the bit lines in the set is affected by a fault (the convention where a zero indicates a fault is the reverse of the convention in FIGS. 5A and 5B). The structure to the left of the dotted line is repeated for the bit lines in the set, so that copies of the same structure are repeatedly connected to the XDOUT line 616 for multiple bit lines.

Initially, the XDOUT line is pulled high (to the VDD voltage 612, indicating a binary one, or the absence of a fault) by pulling the XOFF line 614 low. The latch 606 connected to the Q line 610 may be similar to the data registers 510 of FIGS. 5A and 5B, so that the Q line 610 for a bit line is zero (lower or VSS voltage 614) if the bit line is not affected by a fault, and one (higher or VDD voltage 612) if the bit line is affected by a fault. The LATCH_WL line 604 may correspond to a particular column or bit line, and may be activated (pulled high, to VDD voltage 612) to allow the corresponding latch 606 to affect the XDOUT line 616, via the Q line 610.

In one embodiment, the XDOUT line 616 may be pulled high or low depending on the value of the Q line 610. If XCR 602 is set to 1, then XLATCH_WL 608 is the inverse of LATCH_WL 604. If LATCH_WL 604 is not activated for a bit line (set to 0), then XLATCH_WL 608 is 1, and XDOUT 616 will not be pulled high or low by the Q line 610 for that bit line. However, if LATCH_WL 604 is activated for a bit line (set to 1), then XLATCH_WL 608 is 0, and XDOUT 616 will be pulled low, indicating a fault for the bit line if Q 610 is 1, and will be pulled high, indicating no fault for the bit line, if Q 610 is 0. Thus, in one embodiment, setting XCR 602 to 1 allows the XDOUT line 616 to be read, to identify individual bit lines affected by faults.

In another embodiment, the XDOUT line 616 is initially pulled high using the XOFF line 614, as described above, and may be pulled low by the Q line 610 if Q is set to 1 for a bit line, but may not pulled high again by Q 610 for another bit line being set to 0. If XCR 602 is set to 0, then XLATCH_WL 608 is 1, preventing Q 610 from pulling XDOUT 616 high. If LATCH_WL 604 is not activated for a bit line (set to 0), then Q 610 for that bit line does not pull XDOUT 616 low or high. However, if LATCH_WL 604 is activated for a bit line (set to 1), then XDOUT 616 will be pulled low if Q 610 is 1, indicating a fault for the bit line, and XDOUT 616 will not be affected if Q 610 is 0. Thus, in a certain embodiment, XCR 602 may be set to zero so that XDOUT 616 condenses information about multiple bit lines affected by faults by being pulled low, and kept low, if any of the bit lines in the set of bit lines are affected by faults.

Additionally, in a further embodiment, existing data latches 606 that record whether a bit line is affected by a fault may be read individually by setting XCR to 1, or may be condensed to indicate whether a set of bit lines is affected by a fault by setting XCR to 0. Thus, in certain embodiments, one data latch 606 for a bit line may perform the function of both a data register 510 and a shared data register 512 as described in FIGS. 5A and 5B, without an additional data latch or data register being added to the hardware of the non-volatile memory medium 400.

Figure 7:
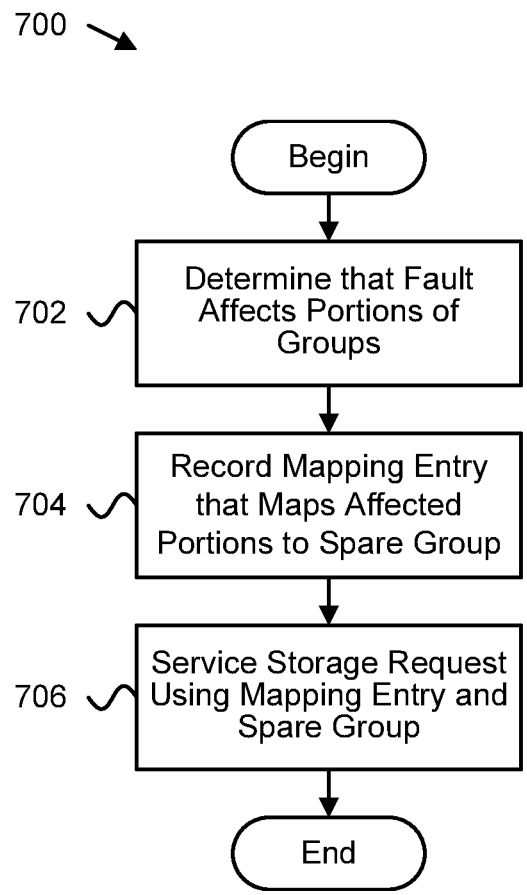
FIG. 7 is a schematic flow chart diagram illustrating one embodiment of a method for redundancy mapping.

FIG. 7 is a schematic flow chart diagram illustrating one embodiment of a method 700 for redundancy mapping. The method 700 begins, and the fault determination module 202 determines 702 that one or more faults affect a portion of a first group of storage cells and a portion of a second group of storage cells. The map module 204 records 704 a mapping entry that maps affected portions of the first and second groups of storage cells to a spare group. The storage request module 206 services 706 a storage request for the first group and/or the second group by referencing the mapping entry and using the spare group of storage cells, and the method 700 ends.

Figure 8:
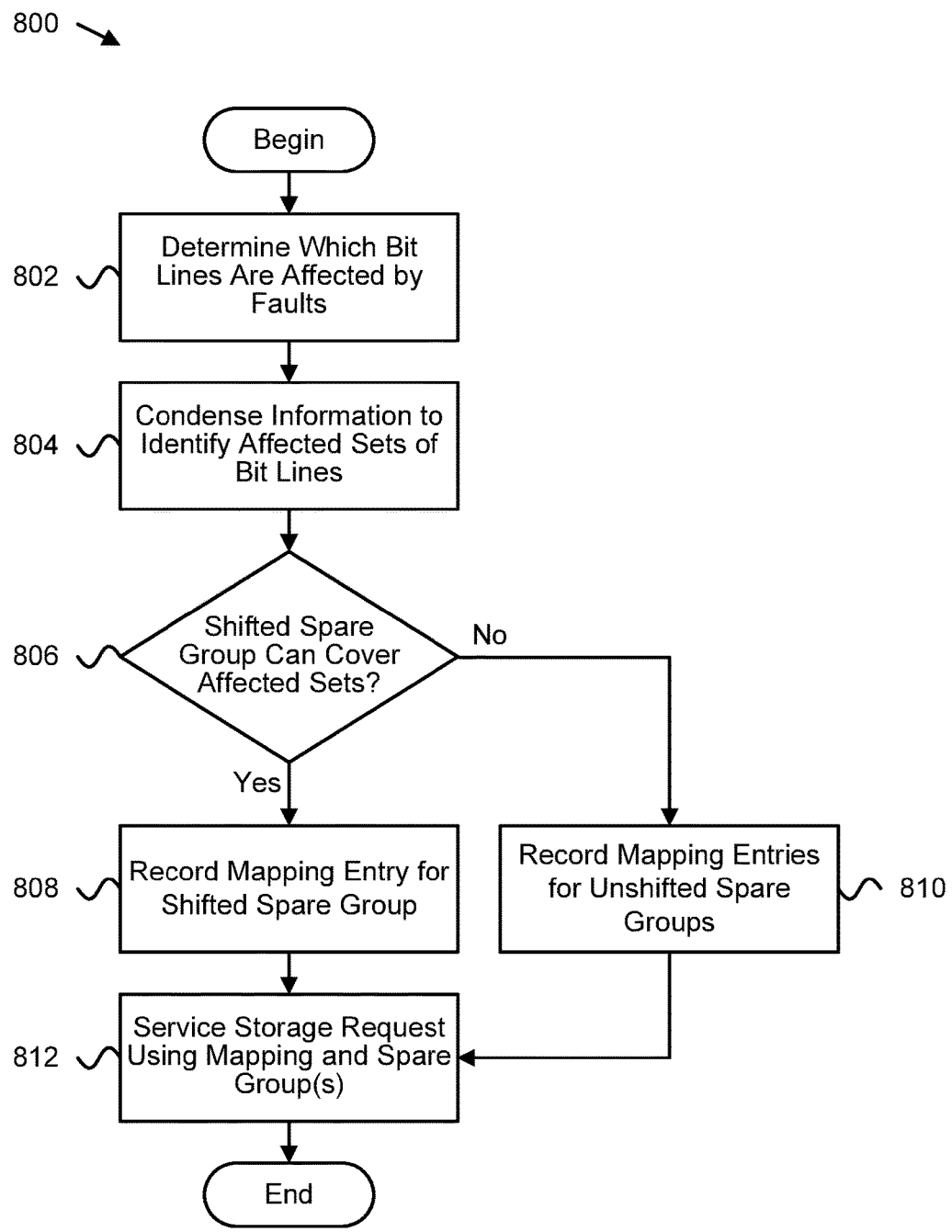
FIG. 8 is a schematic flow chart diagram illustrating another embodiment of a method for redundancy mapping.

FIG. 8 is a schematic flow chart diagram illustrating another embodiment of a method 800 for redundancy mapping. The method 800 begins, and the fault determination module 202 determines 802 which bit lines, in groups of bit lines, are affected by faults. The condense module 306 condenses 804 information about the affected bit lines to identify affected sets of bit lines. The shift determination module 308 determines 806 whether one shifted spare group can cover the affected sets of bit lines. If the affected set of bit lines can be covered by one shifted spare group, the map module 204 records 808 a mapping entry for a shifted spare group. If not, the map module 204 records 810 mapping entries for unshifted spare groups. In either case, the storage request module 206 services 812 a storage request for the first group and/or the second group by referencing the mapping and using the spare group(s) of storage cells, and the method 800 ends.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a controller configured to
      determine that one or more defects affect two adjacent memory units of a non-volatile memory medium, the non-volatile memory medium comprising a plurality of memory units wherein redundant memory units are available for replacing defective memory units;
      determine that the one or more defects affect a contiguous region the size of one memory unit, the contiguous region comprising half of a first memory unit and half of a second memory unit of the two adjacent memory units;
      store a mapping between the contiguous region and a redundant memory unit for the non-volatile memory medium; and
      read data for one or more of the two adjacent memory units by referencing the mapping and using the redundant memory unit.

2. The apparatus of claim 1, wherein a further half of the first memory unit and a further half of the second memory unit are unaffected by the one or more defects, and wherein the data is read from the redundant memory unit and at least one of the unaffected halves.

3. The apparatus of claim 1, wherein a memory unit comprises a plurality of bit lines connected to one sense amplifier.

4. The apparatus of claim 1, wherein the one or more defects comprise a short between a bit line of the first memory unit and a bit line of the second memory unit.

5. The apparatus of claim 1, wherein the mapping comprises group information indicating one of the first memory unit and the second memory unit, and shift information indicating that a relation between the indicated memory unit and the redundant memory unit is shifted so that the affected halves of the first and second memory units are mapped to the redundant memory unit.

6. The apparatus of claim 1, wherein determining that the one or more defects affect the two adjacent memory units comprises detecting at least one of the one or more defects.

7. The apparatus of claim 1, wherein determining that the one or more defects affect the two adjacent memory units comprises referencing a record of previously-detected defects.

8. The apparatus of claim 1, wherein the controller comprises a hardware controller for a storage device, the storage device comprising the non-volatile memory medium.

9. The apparatus of claim 1, wherein the controller comprises a device driver for a storage device, the storage device comprising the non-volatile memory medium, the device driver comprising one or more of logic hardware and executable code, the executable code stored on one or more computer readable storage media.

10. A method comprising:
    determining that one or more faults affect half of a first memory unit and half of a second memory unit of a non-volatile storage medium, wherein the first memory unit and the second memory unit are adjacent memory units in the non-volatile storage medium, and the affected half of the first memory unit is adjacent to the affected half of the second memory unit, the non-volatile storage medium comprising a plurality of memory units wherein spare memory units are available for replacing faulty memory units;
    selecting one of a single shifted spare memory unit and multiple unshifted spare memory units for correcting the one or more faults;
    recording a mapping entry that maps the affected halves of the first and second memory units to a shifted spare memory unit for the non-volatile storage medium, in response to selecting the single shifted spare memory unit for correcting the one or more faults; and
    servicing a storage request for one or more of the first memory unit and the second memory unit by referencing the mapping entry and using the spare memory unit.

11. The method of claim 10, wherein a further half of the first memory unit and a further half of the second memory unit are unaffected by the one or more faults, and wherein the storage request is serviced using the spare memory unit and at least one of the unaffected halves.

12. The method of claim 10, wherein a memory unit comprises a plurality of bit lines connected to one sense amplifier.

13. The method of claim 10, wherein the one or more faults comprise a short between a bit line of the first memory unit and a bit line of the second memory unit.

14. The method of claim 10, wherein the mapping entry comprises group information indicating one of the first memory unit and the second memory unit, and shift information indicating that a mapping between the indicated memory unit and the spare memory unit is shifted so that the affected halves of the first and second memory units are both mapped to the same spare memory unit.

15. The method of claim 10, wherein determining that the one or more faults affect the affected halves of the first and second memory units comprises detecting at least one of the one or more faults.

16. The method of claim 10, wherein determining that the one or more faults affect the affected halves of the first and second memory units comprises referencing a record of previously-detected faults.

17. The method of claim 10, wherein the first and second memory units comprise a plurality of sets of bit lines, and wherein determining that the one or more faults affect the affected halves of the first and second memory units comprises determining which bit lines are affected by the one or more faults, and condensing information about the bit lines to identify which sets of bit lines are affected by the one or more faults.

18. A computer program product comprising a computer readable storage medium storing computer usable program code executable to perform operations, the operations comprising:
    using a shifted spare memory unit in place of both a second half of a first memory unit and a first half of a second memory unit of a non-volatile storage medium, in response to determining that one or more faults affect the second half of the first memory unit and the first half of the second memory unit, wherein the first memory unit and the second memory unit are adjacent memory units in the non-volatile storage medium, and the second half of the first memory unit is adjacent to the first half of the second memory unit; and using two unshifted spare memory units in place of third and fourth adjacent memory units in response to determining that one or more faults affect the third and fourth memory units.

\* \* \* \* \*